(12) United States Patent
Ijuin et al.

(10) Patent No.: US 6,185,239 B1
(45) Date of Patent: Feb. 6, 2001

(54) SEMICONDUCTOR LASER DEVICE

(75) Inventors: Seiji Ijuin; Shoji Hirata; Atsushi Ogasawara, all of Kanagawa (JP)

(73) Assignee: Sony Corporation, Tokyo (JP)

(*) Notice: Under 35 U.S.C. 154(b), the term of this patent shall be extended for 0 days.

(21) Appl. No.: 09/010,197

(22) Filed: Jan. 21, 1998

(30) Foreign Application Priority Data

Jan. 22, 1997 (JP) .................................................... 9-009639

(51) Int. Cl.[7] ..................................................... H01S 3/19

(52) U.S. Cl. ................................ 372/50; 372/29; 372/31

(58) Field of Search ................................ 372/29, 31, 50

(56) References Cited

U.S. PATENT DOCUMENTS

| | | | |
|---|---|---|---|
| 4,692,207 | * | 9/1987 | Bouadma et al. .................... 156/649 |
| 4,847,846 | * | 7/1989 | Sone et al. .............................. 372/50 |
| 5,191,590 | * | 3/1993 | Kuindersma et al. .................. 372/50 |

\* cited by examiner

*Primary Examiner*—James W. Davie
*Assistant Examiner*—Benjamin H. Cushwa
(74) *Attorney, Agent, or Firm*—Sonnenschein, Nath & Rosenthal

(57) ABSTRACT

A semiconductor laser device with reduced threshold current and power consumption. Reflectivity Rr at a rear face of an optical cavity of the laser is set as large as possible. A monitor photodiode used for controlling an output form the laser is provided on a mount at a position to detect the main laser beam emitted from the front face of the optical cavity.

10 Claims, 3 Drawing Sheets

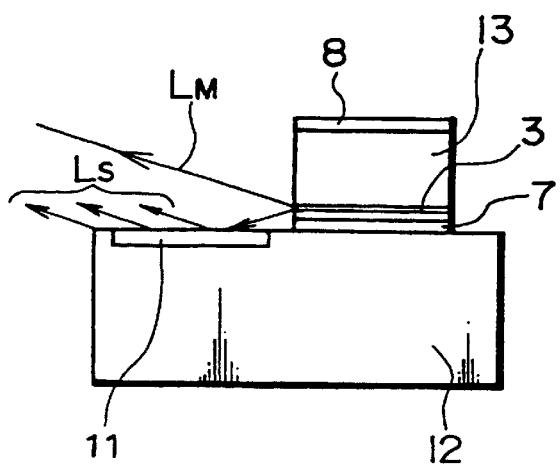
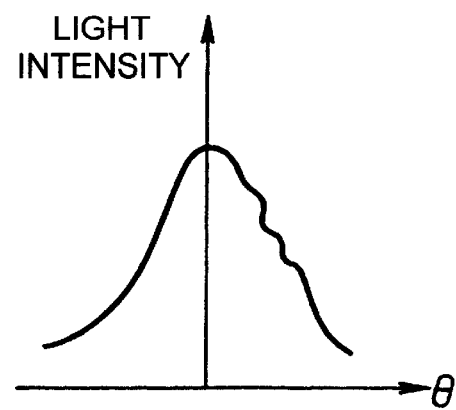
FIG. 1A          FIG. 1B
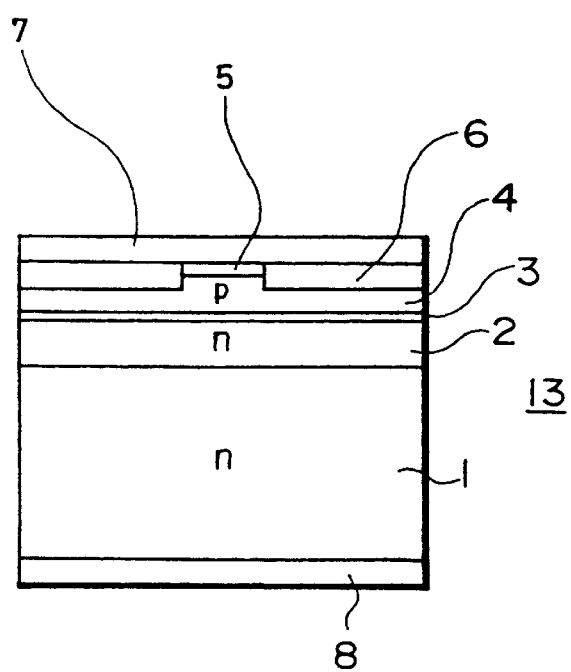
FIG. 2

SEMICONDUCTOR LASER DEVICE

BACKGROUND OF THE INVENTION

1. Field of the Invention

The present invention relates to a semiconductor laser device having a semiconductor laser and a monitor photodetector device for detecting light emitted from the semiconductor laser.

2. Description of the Related Art

A semiconductor laser employs light emitted from one end (front-side end surface) of its cavity as an original output light. In this case, in order to achieve a lower threshold current, i.e., a lower consumed power and higher reliability, reflectivity Rr at the other end (rear-side end surface) of the optical cavity is generally set as high as possible.

However, a general semiconductor laser device employs a so-called rear-monitoring type arrangement in which light emitted from a rear-side end surface of an optical cavity of a semiconductor laser is detected by a photodetector device formed of a photodiode to obtain a monitor signal and an output from the semiconductor laser is controlled based on the monitor signal. In this case, when a sufficient monitor output is desired, since an attempt of increasing the reflectivity Rr at the rear-side end surface of the optical cavity as described above is restricted, the reflectivity Rr at the rear-side end surface of the semiconductor laser of this kind is usually set to about 80% or smaller.

SUMMARY OF THE INVENTION

It is an object of the present invention to solve the above problems by setting reflectivity Rr at a rear-side end surface of an optical cavity of a semiconductor laser device as high as possible.

According to an aspect of the present invention, a monitor photodetector used for controlling an output from a semiconductor laser is formed on a mount where the semiconductor laser is disposed. The photodetector is disposed ahead of an end surface, from which a main beam is irradiated, of the semiconductor laser.

According to the present invention, since a front monitor type arrangement is employed and hence reflectivity Rr at a rear end surface of an optical cavity can be set sufficiently large, e.g., about 100%, i.t., 100% or almost 100%, it is possible to achieve improvement of characteristics of a semiconductor laser such as reduction of a threshold current Ith, a reduced characteristic temperature, improvement of reliability or the like.

BRIEF DESCRIPTION OF THE DRAWINGS

FIG. 1A is a schematic, cross-sectional view of a semiconductor laser device according to the present invention by way of example;

FIG. 1B is a graph showing light intensity distribution of laser light from the semiconductor laser device according to the present invention FIG. 2 is a schematic, cross-sectional view of a semiconductor laser according to the present invention by way of example;

DESCRIPTION OF THE PREFERRED EMBODIMENT

Figure 3:
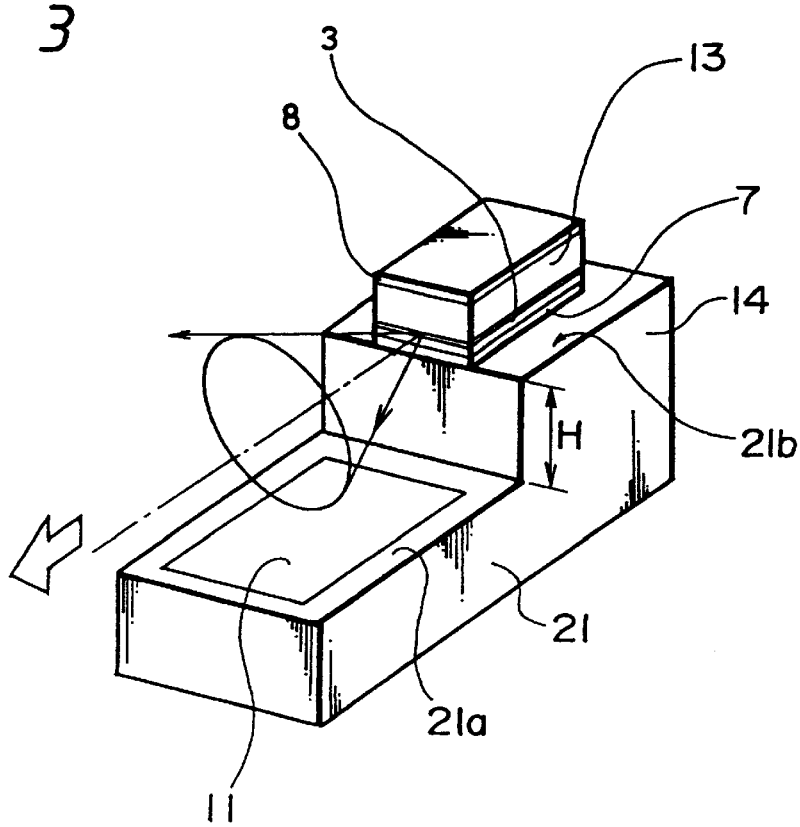
FIG. 3 is a schematic, perspective view of the semiconductor laser device according to the present invention by way of example.

A semiconductor laser device according to an embodiment of the present invention will hereinafter be described.

A semiconductor laser device according to the present invention, as shown in FIG. 1A which is a schematic, cross-sectional view thereof, has a silicon substrate which has a photodiode serving as a monitor photodetector 11 and which is employed as a semiconductor laser fitting mount, and a semiconductor laser mounted thereon. The semiconductor laser device employs a front monitor arrangement in which the photodetector 11 is disposed ahead of the semiconductor laser and a part of forward emitted light, i.e., main beams $L_M$ emitted from a front end surface of a cavity of the semiconductor laser, i.e., from an end surface of an active layer thereof is made incident on the photodetector 11.

The semiconductor laser 13, as shown in FIG. 2 which is a schematic, cross-sectional view thereof, has a first conductive type, e.g., n-type semiconductor substrate 1. A n-type first cladding layer 2, an active layer 3, a second conductive-type, e.g., p-type second cladding layer 4 and a cap layer 5 are successively formed on the semiconductor substrate 1 by epitaxial growth. A current confinement region 6 having a high resistance or first conductive type current confinement region 6 is formed on both sides of a stripe portion so as to sandwich the stripe portion.

One first electrode 7 is deposited on the side of the cap layer 5 so as to have ohmic contact to the cap layer 5, and the other second electrode 8 is deposited on a rear surface of the substrate 1 so as to have ohmic contact to the substrate 1.

The semiconductor laser 13 has reflectivity Rr at a rear end surface of its cavity which can satisfy Rr≈100%.

As described above, since in the semiconductor laser 13 the active layer 3 where the cavity is formed is formed as an epitaxially grown semiconductor layer on the semiconductor substrate 1 with its thickness of about 100 μm, the active layer 3 is positioned at a position away from the second electrode 8 by about 100 μm while being positioned at a position at the position away from the first electrode 7 by several μm.

In a general semiconductor laser, effective radiation of generated heat resulting from recombination of carriers in the vicinity of an active layer, i.e., from light emission is required in order to achieve reduction of an operation current used therein, stable operation thereof for a long period of time, and further increased lifetime thereof. For the effective radiation of heat generated in the vicinity of an active layer, it is preferable to utilize heat radiation from a fitting portion for the semiconductor laser. For this end, as shown in FIG. 1A, the semiconductor laser 13 is fitted to a fitting portion therefor with on the first electrode 7 closer to the active layer 3 being located thereon.

However, when the above arrangement for disposing the electrode 7 on the mount is applied to the front monitor arrangement, main beam light, having large light intensity, of the semiconductor laser is sometimes reflected and diffracted by a surface of a portion where a photodiode serving as the photodetector is disposed, which influences a far field pattern (FFP).

Specifically, when the arrangement shown in FIG. 1A is employed, a part of the laser light is made incident on the photodetector 11 as described above. Practically, as shown in FIG. 1B which is a graph showing a light intensity distribution of the FFP of the laser light relative to an emission angle θ, interference fringes are caused in a part of the distribution by reflection and diffraction of the laser light by the surface where the photodetector 11 is disposed, such as a surface of the photodetector 11 or the like.

The semiconductor laser device according to the embodiment for avoiding the above-mentioned disadvantages will hereinafter be described.

Figure 4:
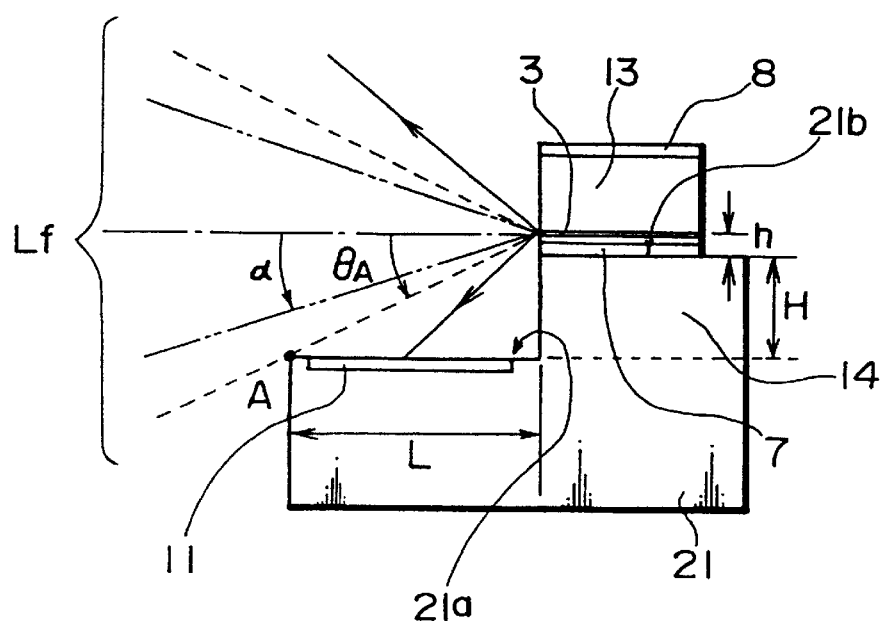
FIG. 4 is a schematic, side view of the semiconductor laser device according to the present invention by way of example.

As shown in FIG. 3 which is a schematic, perspective view showing the semiconductor laser device by way of example and in FIG. 4 which is a side view thereof, a mount 21 formed of a silicon substrate, for example, is provided. The monitor photodetector 11, e.g., a photodiode used for controlling an output of the semiconductor laser 13 and the semiconductor laser 13 are disposed on first and second disposition surfaces 21a and 21b, respectively.

The second disposition surface 21b is formed on a step portion 14 located at a position higher than the first disposition surface 21a by a predetermined height H.

In this embodiment, the semiconductor laser 13 is disposed on the mount 21 with its surface closer to the active layer 3, i.e., the first electrode 7 side surface being bonded onto the second disposition surface 21b. In this case, an optical cavity formed of the active layer 3 is formed so that its front end surface should be agreed with or projected from a front end of the second disposition surface 21b and that the forward emission light should not be completely reflected by the first disposition surface 21a.

Thus, the froward emission light Lf from the semiconductor laser 13 is derived forward and a part of the forward emission light Lf is received by the photodetector 11.

The above arrangement for preventing the forward emission light from being completely reflected will be specifically be described.

Assuming that the semiconductor laser 13 provides a vertical direction FFP distribution of laser light emitted therefrom shown by a solid line in FIG. 5 and that height of the second disposition surface 21b from the first disposition surface 21a is depicted by H and a depth of the first disposition surface 21a, i.e., an interval between front edges of the first and second disposition surfaces 21a and 21b is depicted by L, the height H and the depth L are determined as follows. Specifically, a numerical aperture N.A. of an optical system (not shown) for collecting light output from the semiconductor lens is about 0.15. Since the N.A. is given as N.A.=n sin α, α=sin$^{-1}$ (N.A./n)≈8.6° is established. α depicts an angle relative to a radius of an entrance pupil and n depicts a refractive index of a surrounding medium. In this case, the refractive index can be regarded as that in the air and hence n≈1 can be established. Specifically, light from a range of the angle 2α (about 17 to 20°) is made incident on the optical system.

Assuming that a critical angle at which emitted laser light emitted from a front emission point of the cavity is completely reflected by a tip end point A of the first disposition surface 21a of the mount 21 is $\theta_A$, then as long as the critical angle $\theta_A$ has a value larger than α, e.g., $\theta_A \geq 10°$ is established, light reflected by the first disposition surface 21a and influence of diffracted light on FFP of target output light can practically be prevented. Therefore, a relationship between L and H is determined based on the following equation 1 so as to satisfy the following equation 2.

$$\tan \theta_A = (H+h)/L \quad (1)$$

$$\theta_A = \tan^{-1}\{(H+h)/L\} \geq 10° \quad (2)$$

wherein h depicts height from the second disposition surface 21b to the active layer 3.

The values of L and H are set so as to satisfy the equation 2.

Figure 5:
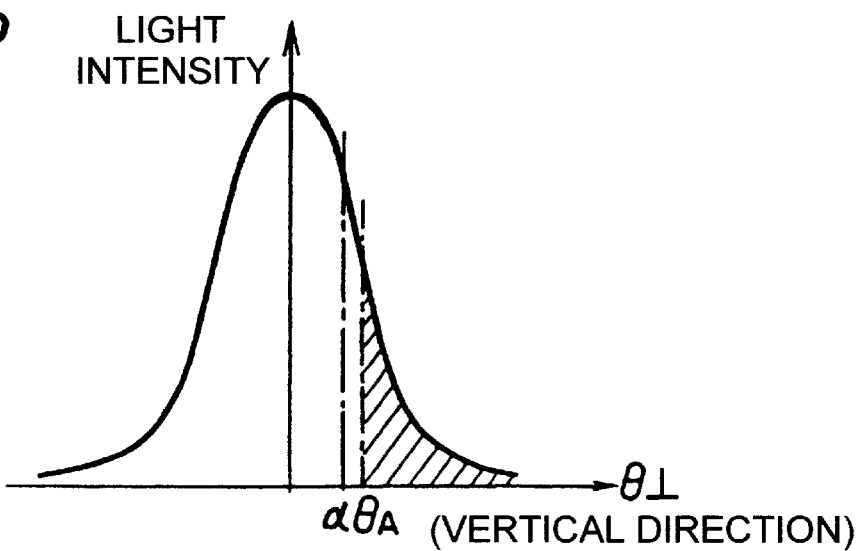
FIG. 5 is a graph showing light intensity distribution of an FFP presented the semiconductor laser device according to the present invention.

If the arrangement of the semiconductor laser device according to the present invention is employed, the forward emission light as shown by hatched lines in a region of $\theta_A \geq 10°$ in FIG. 5 which is the vertical FFP distribution graph can be employed as the monitor light.

The following table 1 shows values satisfying the equation 2 when h=1.5 μm by way of example (i.e., the relationship between L and H when $\theta_A=10°$ (0.1745 rad.) and h=1.5 μm).

TABLE 1

| L (μm) | H (μm) |
|---|---|
| 5000 | 855 |
| 1000 | 175 |
| 500 | 86.5 |
| 100 | 16.1 |

Study of table 1 reveals that even if a value of L is within an order of a length L (about 1.0 μm) of a conventional mount, the necessary height H of the step is prevented from being too large to cause problems in fabrication and from being too small.

According to the arrangement of the present invention, since the front monitor type arrangement is employed and hence the forward emission light, i.e., the output light practically employed as the laser light can be directly observed, it is possible to prevent the monitor error resulting from fluctuation of a ratio of distribution of the forward light and backward emission light as caused when the backward emission light is monitored. As a result, it is possible to carry out the precise monitoring.

Since the front monitor type arrangement is employed and hence the reflectivity Rr at the rear end surface of the optical cavity can be set sufficiently large, it is possible to achieve improvement of the characteristics of the semiconductor laser such as reduction of a threshold current Ith, a lower characteristic temperature, improvement of reliability or the like.

Moreover, in this arrangement, since the active layer 3 disposed close to the mount 21, i.e., the semiconductor laser fitting portion, it is possible to efficiently radiate heat in the active layer 3, i.e., the optical cavity, which provides the advantageous arrangement of the semiconductor laser in view of reduction of an operation current used therein, stable operation thereof for a long period of time and further increase of its lifetime.

While in this embodiment the first and second disposition surfaces 21a and 21b used when the first electrode 7 side of the semiconductor laser 13 is fitted to the mount 21 are integrally formed by the silicon substrate itself in which the photodetector 11 is formed, the present invention is not limited thereto. For example, a block having excellent thermal conductivity, e.g., a metal block having height H may be mounted and jointed on the silicon substrate, its upper surface forming the second disposition surface 21b.

Figure 6:
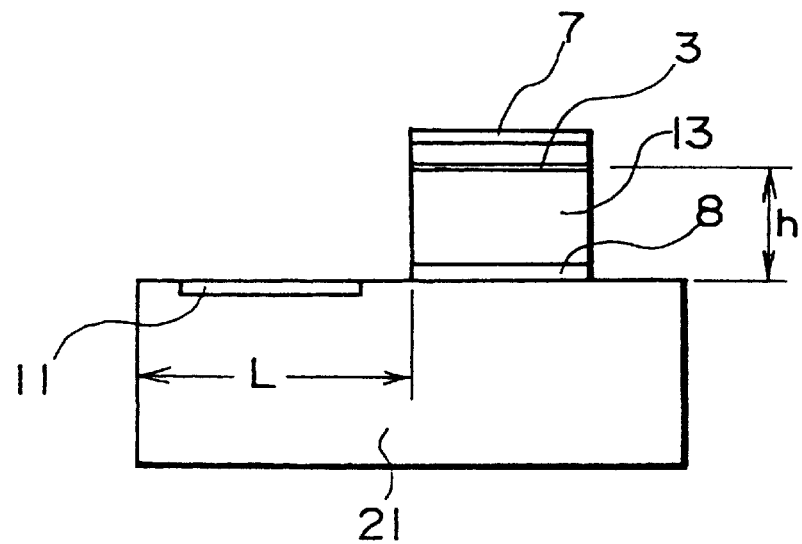
FIG. 6 is A schematic, side view of another example of the semiconductor laser device according to the present invention.

While in this embodiment the step portion 14 of the mount 21 is provided to secure the height (H+h) of the light emission end from the disposition surface 21a where the photodetector 11 is formed, it is possible to achieve the same effect by employing an arrangement in which, as shown in FIG. 6 which is a schematic, cross-sectional view thereof, the mount 21 is formed so as to have a substantially flat upper surface and a semiconductor laser 13 is jointed onto a first disposition surface 21a, where a photodetector 11 is formed, of a mount 21 with its second electrode 8 further away from an active layer 3 being located on the first disposition surface 21a. In this case, since it is unnecessary to provide the disposition surface for the semiconductor laser 13 at a position higher by height H as compared with the deposition surface of the photodetector 11, it is not necessary to carry out a manufacturing process such as an etching process for forming a step portion (as shown in FIG. 3, for example) on the mount 21, which can facilitate the manufacturing processes of the semiconductor laser device.

In the above arrangement, since the distance h from the rear surface of the substrate 1 to an active layer 3, i.e., a light emission end is about 100 $\mu$tm, study of the above table 1 reveals that it is sufficient to set the distance L to 600 to 700 $\mu$m. Specifically, also in this case, it is possible to avoid the disadvantage resulting from the photodetector 11 provided ahead of the semiconductor laser, which can realize the front monitor type arrangement.

According to the arrangement of the present invention, since the front monitor type arrangement is employed and hence the forward emission light, i.e., the output light practically employed as the laser light can be directly observed, it is possible to prevent the monitor error resulting from fluctuation of a ratio of distribution of the forward light and backward emission light as caused when the backward emission light is monitored. As a result, it is possible to carry out the precise monitoring.

Since the front monitor type arrangement is employed and hence the reflectivity Rr at the rear end surface of the optical cavity can be set sufficiently large, it is possible to achieve improvement of the characteristics of the semiconductor laser such as reduction of a threshold current Ith, a lower characteristic temperature, improvement of reliability or the like.

According to the arrangement of the present invention, it is possible to prevent the disposition surface where the photodetector is disposed from interfering with the FFP of the forward output light.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A semiconductor laser device, comprising:
    a semiconductor laser having a front end face from which a main laser beam is emitted and a rear end face from which a rear laser beam is emitted;
    a mount on which said semiconductor laser is disposed;
    a photodetector used for controlling an output from said semiconductor laser and also formed on said mount, wherein said photodetector is disposed to detect a main laser beam emitted from said front end, but said photodetector is not located in the path of said main beam
    wherein,
    assuming that a critical angle at which a main beam of said semiconductor laser is completely reflected by a tip end of said mount where said photodetector is disposed is $\theta$, a numerical aperture of an optical system for collecting the main beam from said semiconductor laser is N.A. and refractive index of a surrounding medium is n, then said $\theta$ satisfies the relationship $\theta > \alpha$ where $(\alpha = \sin^{-1}(N.A./n))$.

2. A semiconductor laser device according to claim 1, wherein a surface where said semiconductor laser is disposed is located at a position higher than a surface where said photodetector is disposed.

3. A semiconductor laser device according to claim 1, further comprising a first electrode located between said semiconductor laser and said mount and located closer to an active layer of said semiconductor than a second electrode attached to said semiconductor laser said first electrode being secured onto said mount through a metal.

4. A semiconductor laser device according to claim 1, wherein reflectivity at a rear end surface of said semiconductor laser is about 100%.

5. A semiconductor laser device according to claim 1, further comprising a first electrode located between said semiconductor laser and said mount and located closer to an active layer of said semiconductor than a second electrode attached to said semiconductor laser said first electrode being secured onto said mount through a metal.

6. A semiconductor laser device according to claim 2, wherein reflectivity of said rear end face of said semiconductor laser is about 100%.

7. A semiconductor laser device, comprising:
    a semiconductor laser having a front end face from which a main laser beam is emitted and a rear end face from which a rear laser beam is emitted;
    a mount on which said semiconductor laser is disposed;
    a photodetector used for controlling an output from said semiconductor laser and also formed on said mount, said photodetector disposed to detect a main laser beam emitted from said front end; and
    an electrode attached to said semiconductor laser between said semiconductor laser and said mount is located further from an active layer of said semiconductor laser than another electrode attached to the semiconductor laser.

8. A semiconductor laser device, comprising:
    a semiconductor laser having a front end face from which a main laser beam is emitted and a rear end face from which a rear laser beam is emitted;
    a mount on which said semiconductor laser is disposed;
    a photodetector used for controlling an output from said semiconductor laser and also formed on said mount, wherein said photodetector is disposed to detect a main laser beam emitted from said front end;
    an electrode attached to said semiconductor laser between said semiconductor laser and said mount is located further from an active layer of said semiconductor laser than another electrode attached to the semiconductor laser; and
    wherein,
    assuming that a critical angle at which a main beam of said semiconductor laser is completely reflected by a tip end of said mount where said photodetector is disposed is $\theta$, a numerical aperture of an optical system for collecting the main beam from said semiconductor laser is N.A. and refractive index of a surrounding medium is n, then said $\theta$ satisfies the relationship $\theta > \alpha$ where $(\alpha = \sin^{-1}(N.A./n))$.

9. A semiconductor laser device comprising:

a semiconductor laser having a front end face from which a main laser beam is emitted and a rear end face from which a rear laser beam is emitted;

a mount on which said semiconductor laser is disposed;

a photodetector used for controlling an output from said semiconductor laser and also formed on said mount, wherein said photodetector is disposed to detect a main laser beam emitted from said front end, but said photodetector is not located in the path of said main beam; and an electrode attached to said semiconductor laser but located further from an active layer of said semiconductor laser than another electrode attached to the semiconductor laser and secured onto said mount, wherein, a surface where said semidconductor laser is disposed is located at a position higher than a surface where said photodetector is disposed.

10. A semiconductor laser device comprising:

a semiconductor laser having a front end face from which a main laser beam is emitted and a rear end face from which a rear laser beam is emitted;

a mount on which said semiconductor laser is disposed; and a photodetector used for controlling an output from said semiconductor laser and also formed on said mount, wherein said photodetector is disposed to detect a main laser beam emitted from said front end, but said photodetector is not located in the path of said main beam, wherein, a surface where said semidconductor laser is disposed is located at a position higher than a surface where said photodetector is disposed, and assuming that a critical angle at which a main beam of said semiconductor laser is completely reflected by a tip end of said mount where said photodetector is disposed is $\theta$, a numerical aperture of an optical system for collecting the main beam from said semiconductor laser is N.A. and refractive index of a surrounding medium is n, then said $\theta$ satisfies the relationship $\theta > \alpha$ where $(\alpha = \sin^{-1}(N.A./n))$.

* * * * *